United States Patent
Nosaka (10) Patent No.: US 9,126,766 B2
(45) Date of Patent: Sep. 8, 2015

(54) MANUFACTURING METHOD OF SEMICONDUCTOR DEVICE, AND SEMICONDUCTOR DEVICE

(71) Applicant: Renesas Electronics Corporation, Kawasaki-shi, Kanagawa (JP)

(72) Inventor: Takayuki Nosaka, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/264,166

(22) Filed: Apr. 29, 2014

(65) Prior Publication Data

US 2014/0335632 A1    Nov. 13, 2014

(30) Foreign Application Priority Data

May 10, 2013    (JP) .................................. 2013-099894

(51) Int. Cl.
| | | |
|---|---|---|
| *H01L 21/00* | (2006.01) | |
| *B65G 35/00* | (2006.01) | |
| *H01L 21/768* | (2006.01) | |
| *H01L 21/67* | (2006.01) | |
| *H01L 21/677* | (2006.01) | |

(52) U.S. Cl.
CPC .......... *B65G 35/00* (2013.01); *H01L 21/67046* (2013.01); *H01L 21/67051* (2013.01); *H01L 21/6776* (2013.01); *H01L 21/67173* (2013.01); *H01L 21/7684* (2013.01); *H01L 21/76801* (2013.01)

(58) Field of Classification Search
None
See application file for complete search history.

(56) References Cited

U.S. PATENT DOCUMENTS

| | | | | |
|---|---|---|---|---|
| 5,240,546 | A | * | 8/1993 | Shiga ............................. 156/378 |
| 6,540,587 | B1 | | 4/2003 | Gotkis et al. |
| 8,574,330 | B2 | | 11/2013 | Namie et al. |

FOREIGN PATENT DOCUMENTS

| | | |
|---|---|---|
| JP | 2005-505122 A | 2/2005 |
| WO | WO 2008/044477 A1 | 4/2008 |

* cited by examiner

*Primary Examiner* — Kyoung Lee
(74) *Attorney, Agent, or Firm* — Miles & Stockbridge P.C.

(57) ABSTRACT

Provided is a semiconductor device that suppresses the occurrence of defects due to photocorrosion. A method for manufacturing the semiconductor device includes the steps of: forming an insulating layer with a concave portion over a substrate; forming a conductive film over the insulating film and the inside of the concave portion; polishing and removing the conductive film positioned over the insulating layer; and cleaning the insulating layer in a light-shielded state. Between the step of polishing and the step of cleaning, or after the step of cleaning, the substrate SUB is moved by detecting the presence or absence of the substrate SUB in the light-shielded state using an infrared sensor.

11 Claims, 10 Drawing Sheets

MANUFACTURING METHOD OF SEMICONDUCTOR DEVICE, AND SEMICONDUCTOR DEVICE

CROSS-REFERENCE TO RELATED APPLICATIONS

The disclosure of Japanese Patent Application No. 2013-099894 filed on May 10, 2013 including the specification, drawings and abstract is incorporated herein by reference in its entirety.

BACKGROUND

The present invention relates to manufacturing methods of semiconductor devices, and semiconductor devices, and more particularly, to a technique applicable to a manufacturing method of a semiconductor device including a step of polishing and removing a conductive film, and a semiconductor device manufactured by the same.

One of processes used in a step of forming a wiring layer of a semiconductor device is chemical mechanical polishing (CMP). The outline of the step using CMP is as follows. First, a concave portion is formed in an insulating layer over a substrate, and a conductive film is formed over the inside of the concave portion and the insulating layer. Then, the conductive film over the insulating layer is polished and removed by use of a slurry. Thereafter, the substrate is cleaned.

Techniques regarding the CMP include, for example, a technique disclosed in Patent Document 1 and a technique disclosed in Patent Document 2.

As disclosed in Patent Document 1, in forming a copper wiring by the CMP method, the copper wiring often undergoes photocorrosion. Further, as disclosed in Patent Documents 1 and 2, the emission of infrared light from the substrate is detected to determine the state of the CMP process.

RELATED ART DOCUMENTS

Patent Documents

[Patent Document 1] Japanese Unexamined Patent Publication No. 2005-505122
[Patent Document 2] WO 2008/044477

SUMMARY

Some materials for a conductive film can cause the photocorrosion in the conductive film. On the other hand, water is an essential factor in the CMP step. In order to suppress the photocorrosion in the CMP step, a series of processes needs to be performed in a light-shielded state. However, if the inside of a processor is brought into the light-shielded state, it becomes difficult to distinguish between the presence and absence of the substrate while carrying the substrate.

For this reason, some processors include a light source used for determining the presence or absence of the substrate. The light source is designed to be lit up only while carrying the substrate. In order to suppress the photocorrosion, the intensity of light emitted from the light source is reduced as much as possible. With miniaturization of wirings, however, defects tend to occur in semiconductor devices due to the photocorrosion even though the amount of light for detecting the presence or absence of the substrate is reduced to the minimum necessary level. Therefore, a new system is required that can detect the presence or absence of the substrate.

Other problems and new features of the present invention will be clarified in the following detailed description in connection with the accompanying drawings.

According to one embodiment of the invention, a substrate is moved by detecting the presence or absence of the substrate in the light-shielded state using a sensor between the step of polishing and removing a conductive film and the step of cleaning, or after the step of cleaning.

In the one embodiment of the invention, a semiconductor device is provided which can suppress the occurrence of defects due to the photocorrosion.

DETAILED DESCRIPTION

In the following, preferred embodiments of the present invention will be described with reference to the accompanying drawings. Wherever possible, the same reference numerals will be used through the drawings to refer to the same or like parts, and thus a description thereof will be omitted below.

First Embodiment

Figure 1:
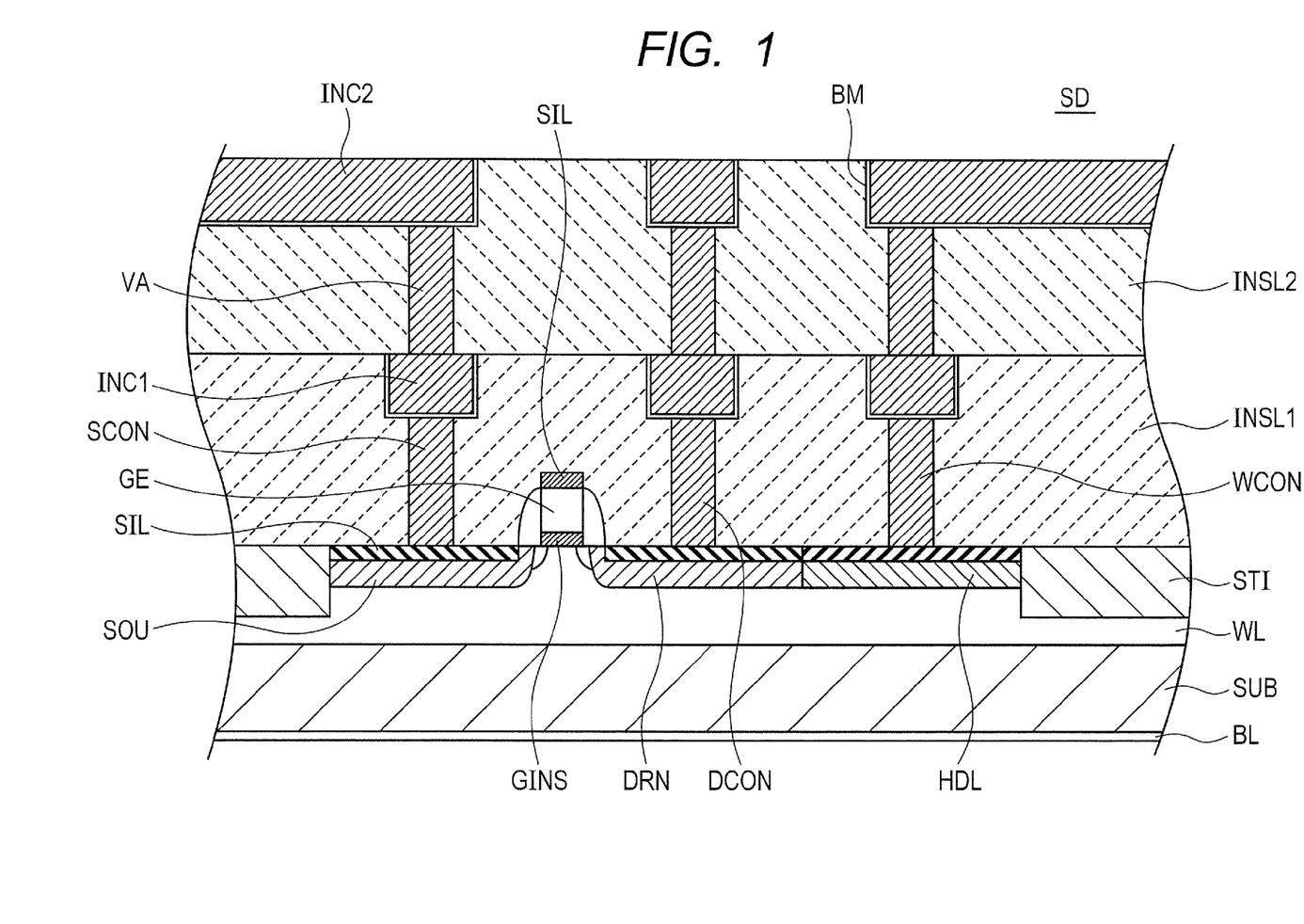
FIG. 1 is a cross-sectional view showing the structure of a semiconductor device according to a first embodiment of the invention.

FIG. 1 shows a cross-sectional view of the structure of a semiconductor device SD according to a first embodiment of the invention. An element isolation film STI and a transistor are formed at a substrate SUB. The element isolation film STI serves to isolate a region where the transistor is formed (element formation region) from other regions. The element isolation film STI is formed, for example, by a STI method, but may be formed by a LOCOS method.

The transistor is formed using a well WL formed in the substrate SUB. In the well WL, a source region SOU and a drain region DRN of the transistor are formed. The source layer SOU and the drain region DRN are an impurity region of an opposite conduction type to that of the well WL. A gate insulating film GINS and a gate electrode GE are stacked in that order in a region sandwiched between the source region SOU and the drain region DRN over the surface of the substrate SUB in the planar view. The gate insulating film GINS is, for example, a silicon oxide film, but may be formed of an insulating film other than the silicon oxide film, for example, a material having a higher dielectric constant than that of silicon oxide. The gate electrode GE is formed of, for example, polysilicon, but may be formed of other conductive materials, including metal, such as TiN.

When the gate electrode GE is formed of polysilicon, a silicide SIL is formed over the gate electrode GE. The silicide SIL is also formed over the source layer SOU and the drain region DRN.

A multilayer interconnection layer is formed over the substrate SUB. The multilayer interconnection layer includes insulating layers INSL1 and INSL2. The insulating layer INSL1 is formed over the substrate SUB, and the insulating layer INSL2 is formed over the insulating layer INSL1. Each of the insulating layers INSL1 and INSL2 serves as an interlayer insulating film included in the multilayer interconnection layer. In an example shown in the figure, a wiring INC1 is embedded in a superficial layer portion of the insulating layer INSL1, and a wiring INC2 is embedded in a superficial layer portion of the insulating layer INSL2. Both wirings INC1 and INC2 each are a copper wiring. The wiring INC2 is coupled to the wiring INC1 through a via VA embedded in the insulating layer INSL2.

The wirings INC1 and INC2 have a barrier metal film BM formed on its bottom and side surfaces. The barrier metal film BM includes, for example, a TiN film or TaN film.

A source contact SCON and a drain contact DCON are embedded in the insulating layer INSL1. The source contact SCON is coupled to the source region SOU. The drain contact DCON is coupled to the drain region DRN. Although not shown, a contact is also embedded in the insulating layer INSL1 to be coupled to the gate electrode GE. The source contact SCON, the drain contact DCON, and the contact coupled to the gate electrode GE are respectively coupled to different wirings INC1.

A contact WCON is also embedded in the insulating layer INSL1. The contact WCON is coupled to a high-concentration region HDL formed in the well WL. The high-concentration region HDL has the same conduction type as that of the well WL, and has a higher impurity concentration than that of the well WL. The high-concentration region HDL is provided for supplying a reference potential to the well WL. The silicide SIL is formed also in the superficial layer portion of the high-concentration region HDL.

A backside film BL is formed on the backside of the substrate SUB. The backside film BL is simultaneously formed with the gate electrode GE. Thus, the backside film BL has a layer formed of the same material as that of the gate electrode GE.

The semiconductor device SD is formed, for example, in the following way. First, the well WL is formed in the substrate SUB, and further the element isolation film STI is formed therein. Thus, the element formation region is isolated. Then, the gate insulating film GINS and the gate electrode GE are formed in the substrate SUB positioned in the element formation region.

Next, extension regions for the source layer SOU and the drain region DRN are formed in the substrate SUB positioned in the element formation region. Then, sidewalls are formed over the sidewalls of the gate electrode GE. Thereafter, the source region SOU and the drain region DRN are formed in the substrate SUB positioned in the element formation region by ion implantation. In this way, a MOS transistor is formed over the substrate SUB.

The high-concentration region HDL is formed in the substrate SUB positioned in the element formation region by the ion implantation.

A metal layer for forming a silicide is formed over the gate electrode GE, the source layer SOU, the drain region DRN, and the high-concentration region HDL. Then, the metal layer is subjected to heat treatment. A silicide SIL is formed over the gate electrode GE, the source layer SOU, the drain region DRN, and the high-concentration region HDL. Then, parts of the metal layer not silicided are removed.

Thereafter, the multilayer interconnection layer is formed over the element isolation film and the MOS transistor.

Figure 2A:
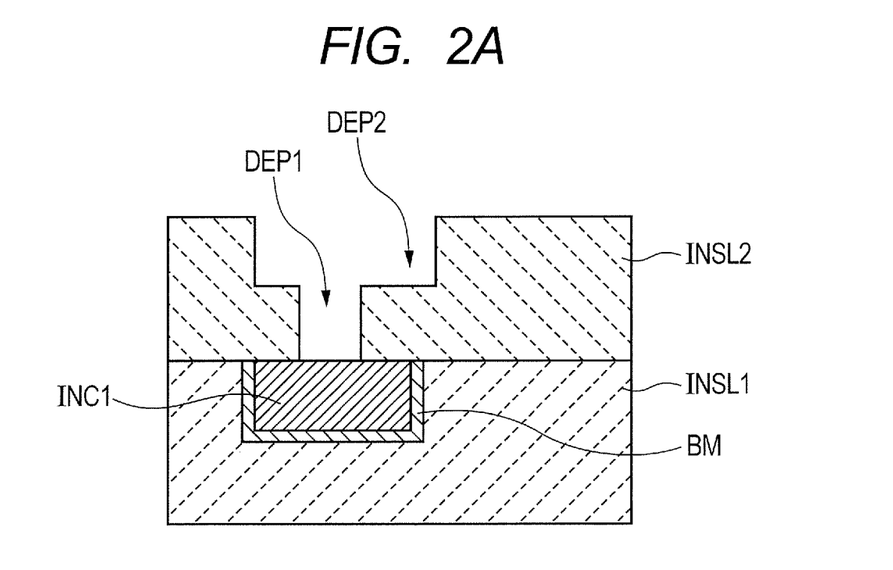
FIGS. 2A and 2B are diagrams for explaining a method for forming a multilayer interconnection layer.
Figure 2B:
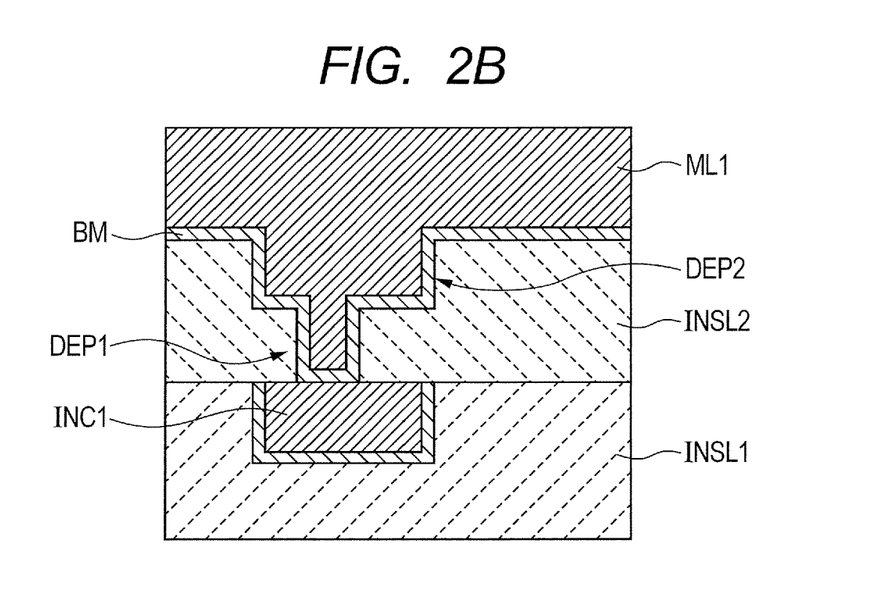
Figure 3:
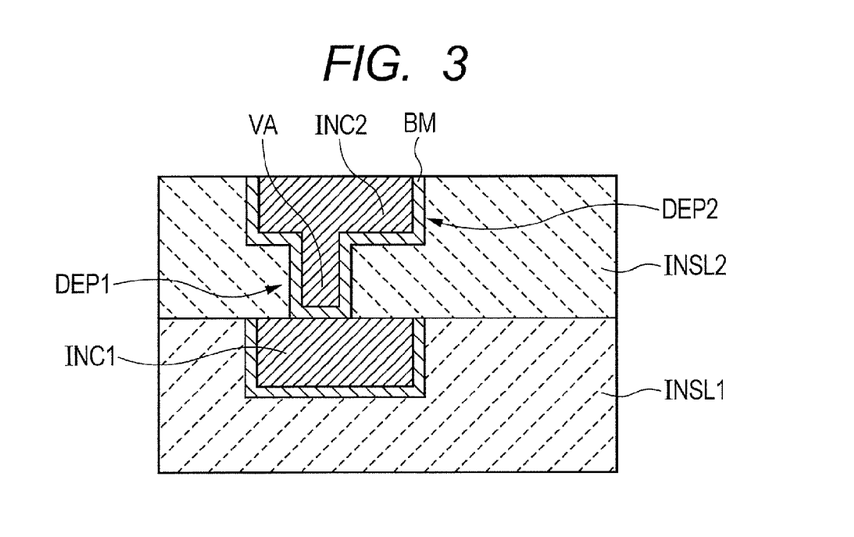
FIG. 3 is another diagram for explaining the method for forming a multilayer interconnection layer.

FIGS. 2 and 3 are diagrams for explaining the method for forming the multilayer interconnection layer. These figures show a method for forming the insulating layer INSL2, the via VA, and the wiring INC2 over the insulating layer INSL1. The wiring INC1 is embedded in the insulating layer INSL1. The wiring INC1 is formed by a damascene method.

First, as shown in FIG. 2A, the insulating layer INSL2 is formed over the insulating film INSL1, for example, by the CVD method. At this time, a connection hole DEP1 (concave portion) and a wiring trench DEP2 (concave portion) are formed in the insulating layer INSL2. The connection hole DEP1 is a hole adapted to fill in via VA, and penetrating the insulating layer INSL2. The wiring trench DEP2 is a trench adapted to fill in the wiring INC2, and not penetrating the insulating layer INSL2. The connection hole DEP1 is provided at a part of the bottom of the wiring trench DEP2.

Then, as shown in FIG. 2B, the barrier metal film BM and seed film are formed over the bottom and side surfaces of the wiring trench DEP2, the bottom and side surfaces of the connection hole DEP1, and the insulating layer INSL2 by sputtering. The seed film is, for example, a Cu film. Then, electrolytic plating is performed using the seed film as a mask. A metal film ML1, for example, a Cu film is formed over the inside of the wiring trench DEP2, the inside of the connection hole DEP1, and the insulating layer INSL2.

Then, as shown in FIG. 3, the metal film ML1 positioned above the insulating layer INSL2 is polished with a part thereof removed therefrom. Thus, the via VA and the wiring INC2 are formed. The barrier metal film BM is provided between the via VA and wiring INC2, and the insulating layer INSL2. Thereafter, the substrate SUB is cleaned. The polishing process and the cleaning process are performed in the light-shielded state.

Figure 4:
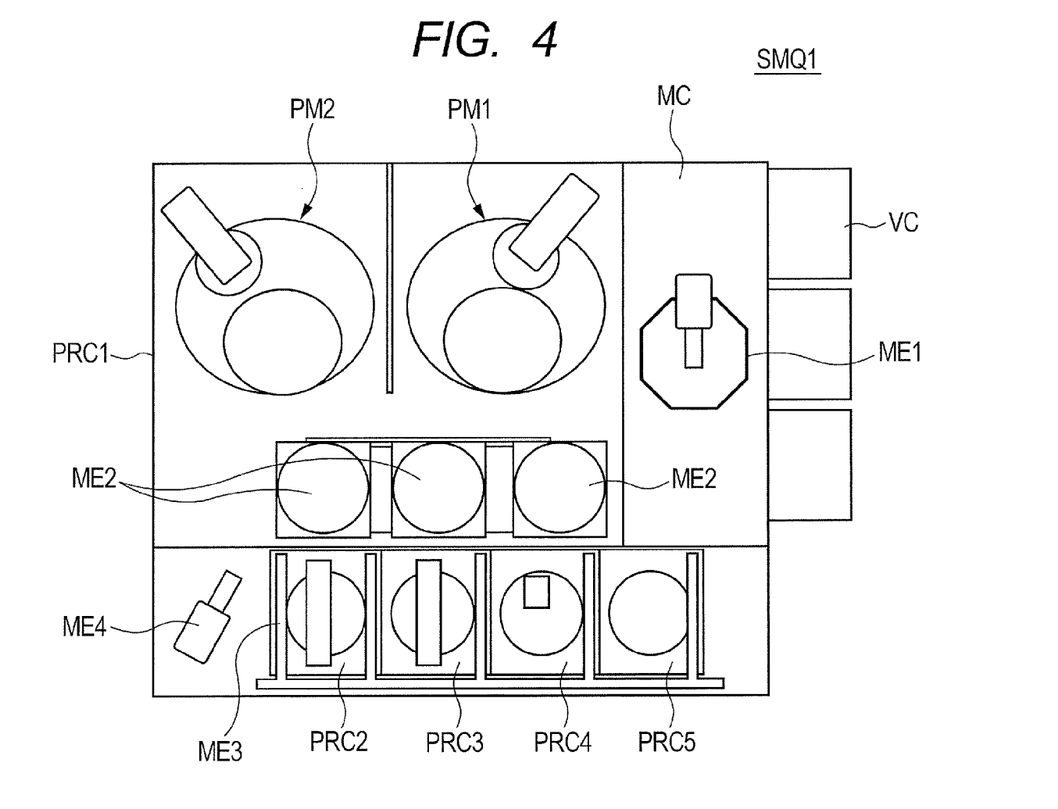
FIG. 4 is a schematic plan view showing the structure of a semiconductor manufacturing apparatus.

FIG. 4 shows a schematic plan view of the structure of a semiconductor manufacturing apparatus SMQ1 used for removing the metal film ML1 positioned over the insulating layer INSL2. The semiconductor manufacturing apparatus SMQ1 includes a transfer chamber MC, a processing chamber PRC1, and a cleaning mechanism. The cleaning mechanism includes cleaning chambers PRC2, PRC3, PRC4, and PRC5.

The transfer chamber MC is provided with a transfer mechanism ME1. The transfer mechanism ME1 returns to the water case VC the substrate SUB processed in the cleaning chamber PRC5 while delivering the substrate SUB accommodated in a wafer case VC into the processing chamber PRC1.

The processing chamber PRC1 includes polishing mechanisms PM1 and PM2 therein. The polishing mechanism PM1 removes a Cu film positioned over the insulating layer INSL2 by the CMP method. The polishing mechanism PM2 removes the barrier metal film BM positioned over the insulating layer INSL2 by the CMP method. The substrate SUB transferred into the processing chamber PRC1 is processed by the polishing mechanism PM1, and then processed by the polishing mechanism PM2. Then, the substrate SUB processed by the polishing mechanism PM2 is transferred to the cleaning chamber PRC2 of the cleaning mechanism.

The transfer of the substrate SUB within the processing chamber PRC1 is performed by transfer mechanisms ME2 (moving portion) located in the processing chamber PRC1. The substrate SUB is transferred from the processing chamber PRC1 to the cleaning chamber PRC2 by a transfer mechanism ME4 (moving portion) within the processing chamber PRC1. The transfer of the substrate SUB within the cleaning chambers PRC2, PRC3, PRC4, and PRC5 is performed by a transfer mechanism ME3 (moving portion).

Figure 5:
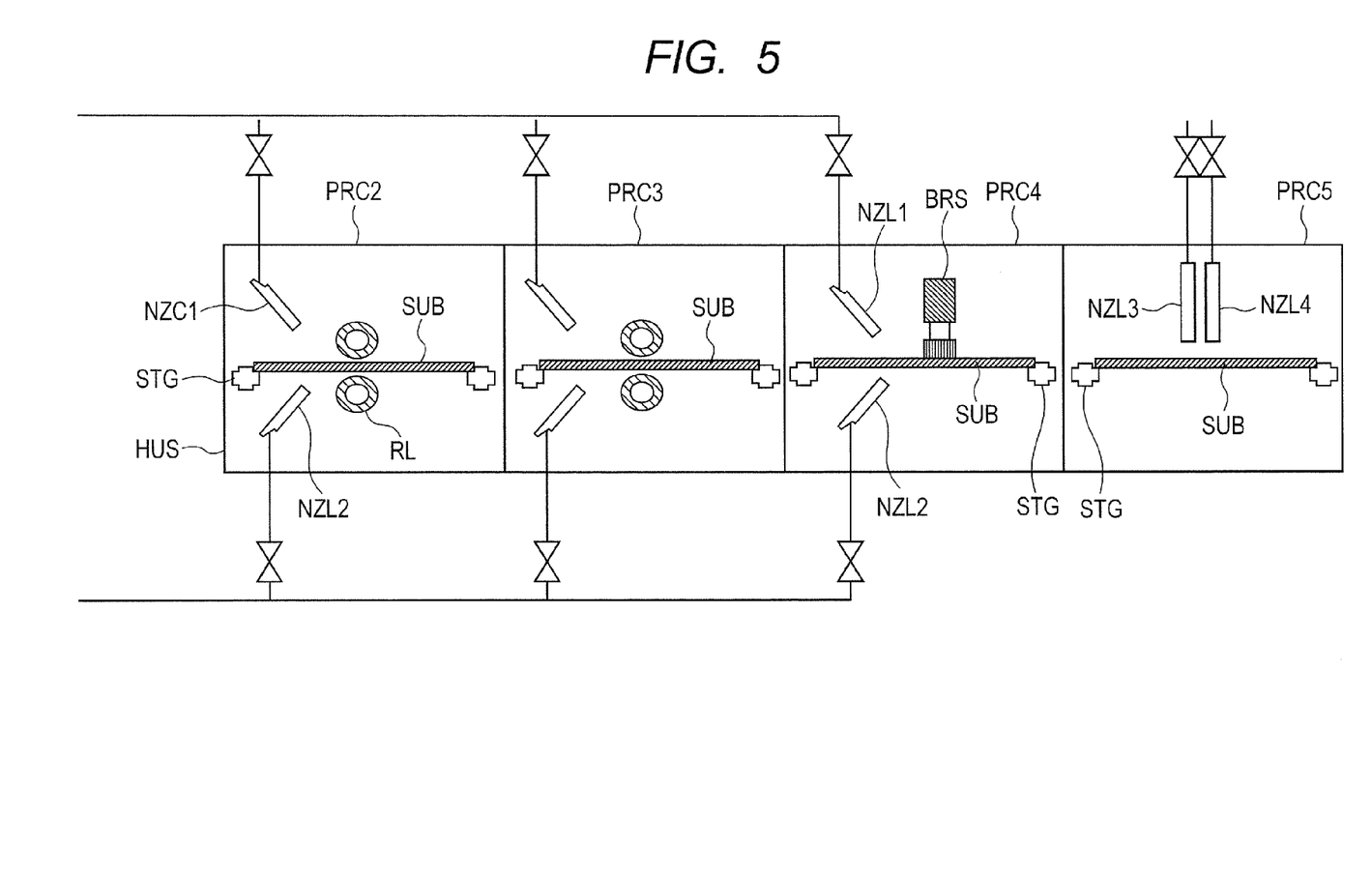
FIG. 5 is a cross-sectional view showing the structure of a cleaning mechanism included in the semiconductor manufacturing apparatus.

FIG. 5 shows a cross-sectional view of the structure of the cleaning mechanism included in the semiconductor manufacturing apparatus SMQ1. As mentioned above, the semiconductor manufacturing apparatus SMQ1 includes the cleaning chambers PRC2, PRC3, PRC4, and PRC5. The substrate SUB is transferred from the cleaning chamber PRC2 to the cleaning chambers PRC3, PRC4, and PRC5 in that order, and cleaned in the respective cleaning chambers.

Substrate supporters STG and nozzles NZL1 and NZL2 are provided in the cleaning chambers PRC2, PRC3, and PRC4. The substrate supporters STG hold the substrate SUB. In an example shown in the figure, the substrate supporters STG hold the substrate SUB horizontally. The nozzle NZL1 supplies a cleaning liquid or pure water to the surface of the substrate SUB. The nozzle NZL2 supplies a cleaning liquid or pure water to the back surface of the substrate SUB.

Roller brushes RL are provided opposed to the front and back surfaces of the substrate SUB in the cleaning chambers PRC2 and PRC3. A pencil brush BRS is provided opposed to the front surface of the substrate SUB in the cleaning chamber PRC4. Both the roller brushes RL and pencil brush BRS are adapted to clean the substrate SUB.

In addition to the substrate supporters STG, nozzles NZL3 and NZL4 are provided in the cleaning chamber PRC5. The nozzle NZL3 supplies pure water to the surface of the substrate SUB. The nozzle NZL4 supplies vapor of IPA (isopropyl alcohol) over the surface of the substrate SUB to dry the surface of the substrate SUB.

Each processing chamber included in the semiconductor manufacturing apparatus SMQ1 is shielded from light by a housing HUS (light shielding member). Thus, the substrate SUB does not receive any light during both processing and transfer.

The above-mentioned transfer mechanisms ME2, ME3, and ME4 detect the respective positions of the substrate SUB in transferring the substrate SUB. Now, a substrate detector for detecting the position of the substrate SUB will be described below.

Figure 6:
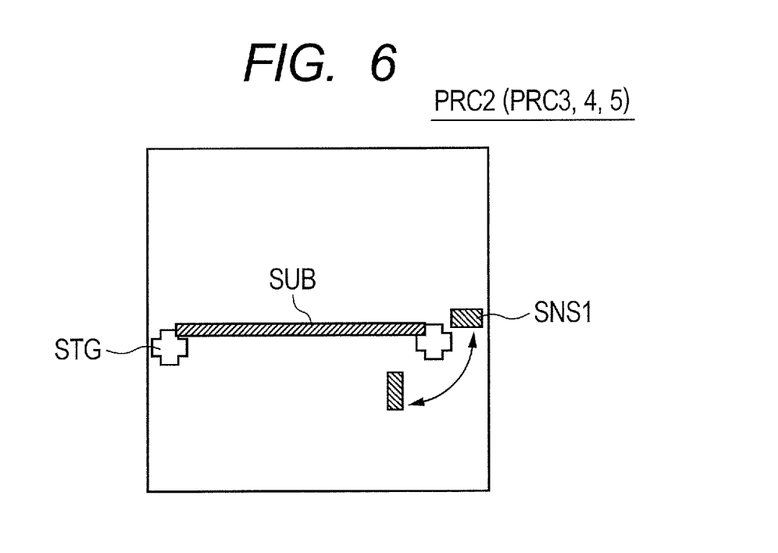
FIG. 6 is a diagram showing the position of a substrate detector.

FIG. 6 shows a diagram of the position of the substrate detector. In an example shown in the figure, the substrate detectors are respectively provided in the cleaning chambers PRC2, PRC3, PRC4, and PRC5. The substrate detectors may be respectively provided in the polishing mechanisms PM1 and PM2.

Each substrate detector includes a sensor. The sensor can detect the position of the substrate SUB in the light-shielded state, and thus does not need an illuminated light. In the example shown in the figure, since the substrate SUB is a silicon substrate, an infrared sensor SNS1 is used as the sensor.

Silicon has a high infrared emissivity. Thus, the substrate detector can detect the presence or absence of the substrate SUB by allowing the infrared sensor SNS1 to detect the infrared light from the substrate SUB. For example, when a detection value from the infrared sensor SNS1 is equal to or more than a reference value in the substrate detector, the wavelength of the infrared light detected by the infrared sensor SNS1 is, for example, in a range of not less than 8 μm nor more than 10 μm.

The infrared sensors SNS1 are preferably provided facing the back surface or side surface of the substrate SUB mounted on the substrate supporters STG. This is because the front surface of the substrate SUB is covered with water or a film made of a cleaning liquid, which reduces the infrared emissivity at the front surface of the substrate SUB.

In this embodiment described above, the semiconductor manufacturing apparatus SMQ1 is provided with the substrate detectors for detecting the position of the substrate SUB. The substrate detector can detect the present or absence of the substrate SUB in the light-shielded state. Thus, the illuminated light is not necessary in detecting the presence or absence of the substrate SUB. Thus, when manufacturing the semiconductor device, the conductive patterns, such as wiring INC2 or via VA can be prevented from causing photocorrosion. Accordingly, this embodiment can suppress the occurrence of the defectives due to the photocorrosion in the semiconductor device.

Second Embodiment

Figure 7:
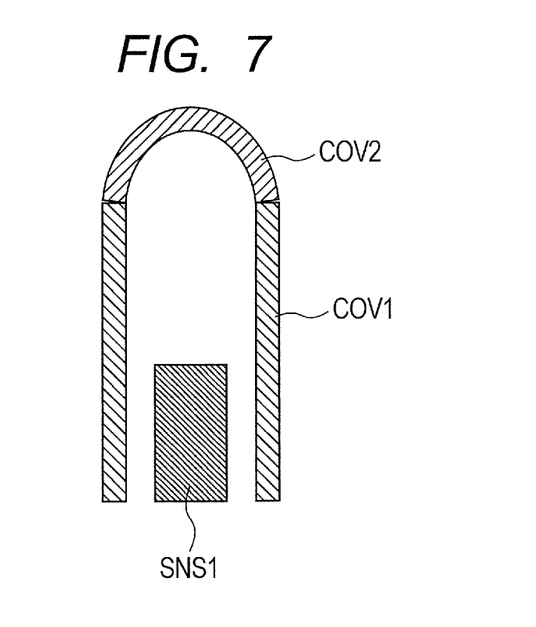
FIG. 7 is a diagram showing the arrangement of an infrared sensor.

FIG. 7 shows a diagram of the arrangement of the infrared sensor SNS1 according to a second embodiment. This embodiment is the same as the first embodiment except that the infrared sensor SNS1 is covered with a cover member COV1.

In an example shown in the figure, the cover member COV1 is a cylindrical member. The cover member COV1 has its upper end covered with an infrared transmissive portion COV2. The infrared transmissive portion COV2 is formed of material for allowing an infrared light to pass therethrough (for example, polyethylene). The surface of the infrared transmissive portion COV2 is preferably made water-repellent, and preferably has an inclined surface (having, for example, a hemispherical shape). This structure can prevent water from being attached to the surface of the infrared transmissive portion COV2.

Also, in this embodiment, the semiconductor device can suppress the occurrence of defects due to the photocorrosion. The infrared sensor SNS1 is covered with the cover member COV1, which can suppress the reduction in detection sensitivity of the substrate SUB due to the presence of water on the infrared sensor SNS1. The surface of the infrared transmissive portion COV2 above the cover portion COV1 is adapted not to allow water to be attached thereto, which can further suppress the reduction in detection sensitivity of the substrate SUB.

Third Embodiment

A manufacturing method of a semiconductor device in this embodiment is the same as that of the first embodiment except that the semiconductor manufacturing apparatus SMQ1 includes an ultrasonic sensor SNS2 instead of the infrared sensor SNS1. The ultrasonic sensor SNS2 includes a source for the ultrasound, and a detection sensor for the ultrasound.

Figure 8:
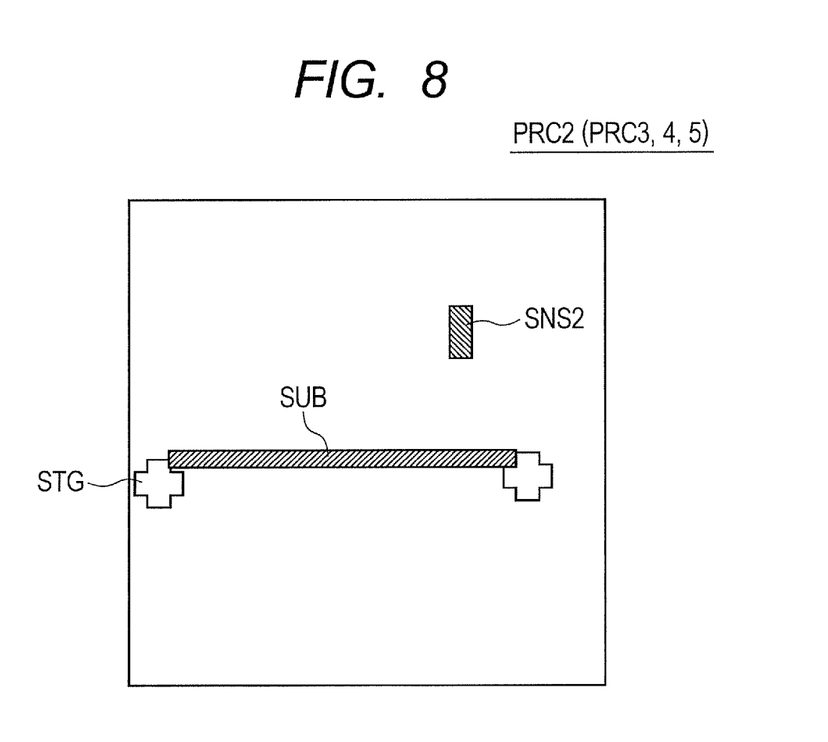
FIG. 8 is a diagram for explaining the arrangement of an ultrasonic sensor.

FIG. 8 is a diagram for explaining the arrangement of the ultrasonic sensor SNS2. As shown in the figure, the ultrasonic sensor SNS2 is disposed above the substrate SUB with its ultrasound emission surface oriented upward, and its ultrasound receiving surface oriented downward. In this way, the liquid, such as water, can be prevented from being attached to the ultrasound emission surface and the ultrasound receiving surface of the sensor.

When detecting the presence or absence of the substrate SUB, the ultrasonic sensor SNS2 emits ultrasound toward the position where the substrate SUB is to be positioned. When the ultrasonic sensor SNS2 detects a reflective wave of the ultrasound having a certain intensity or higher, the sensor SNS2 determines that the substrate SUB is present in the position. The ultrasonic sensor SNS2 is preferably vertical to the substrate SUB. In this way, the detection sensitivity of the ultrasonic sensor SN2 for the reflective wave is enhanced.

Also, in this embodiment of the invention, the semiconductor device can suppress the occurrence of defects due to the photocorrosion.

Fourth Embodiments

Figure 9:
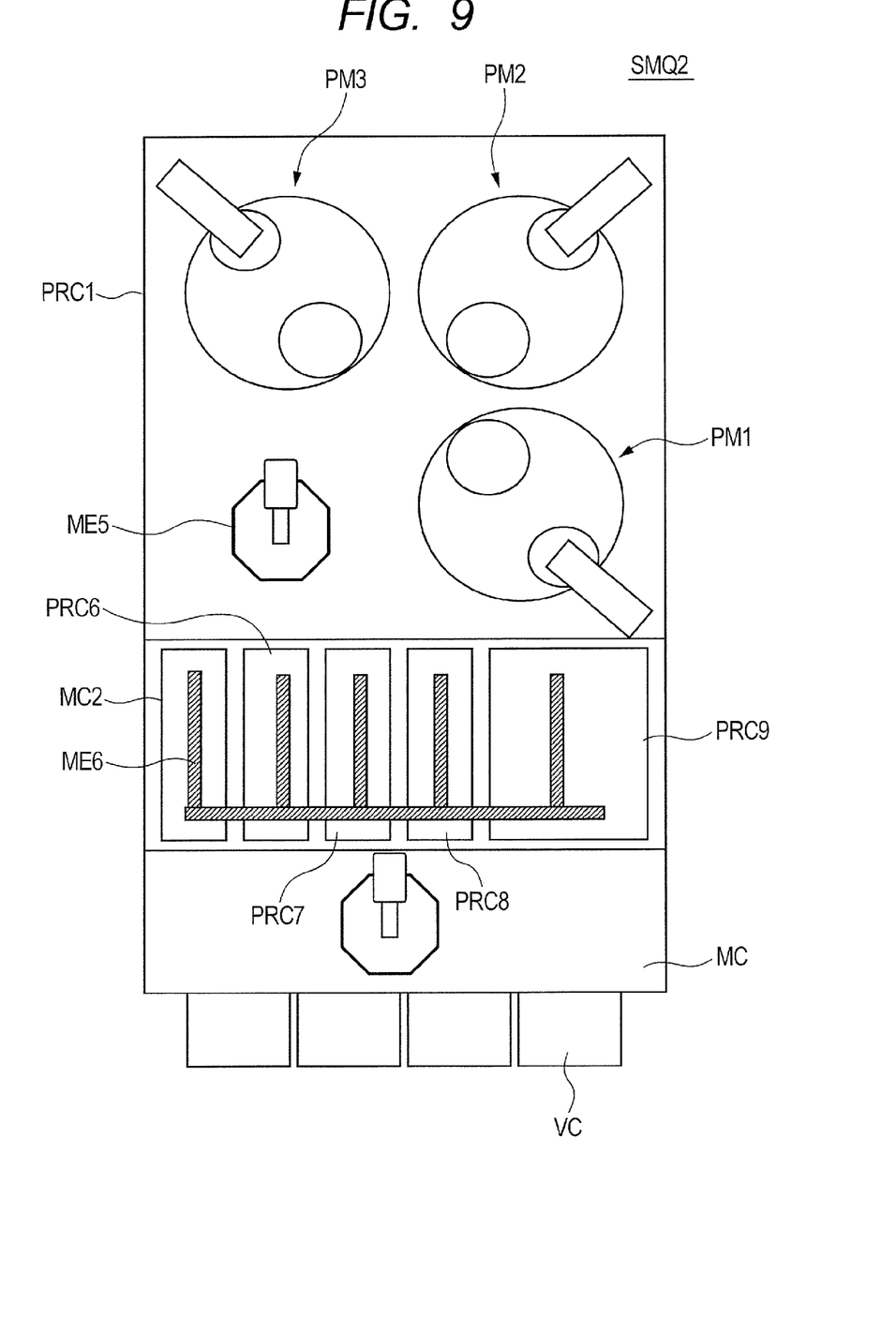
FIG. 9 is a plan view showing the structure of a semiconductor manufacturing apparatus according to a fourth embodiment of the invention.

FIG. 9 shows a plan view of the structure of a semiconductor manufacturing apparatus SMQ2 used in a manufacturing method of the semiconductor device in a fourth embodiment of the invention. This embodiment is the same as any one of the first to third embodiments except for the use of the semiconductor manufacturing apparatus SMQ2 instead of the semiconductor manufacturing apparatus SMQ1.

The semiconductor manufacturing apparatus SMQ2 includes a cleaning mechanism between the transfer chamber MC and the processing chamber PRC1. In addition to the polishing mechanisms PM1 and PM2, a polishing mechanism PM3 is also provided within the processing chamber PRC1. The transfer of the substrate SUB within the processing chamber PRC1, and the transfer of the substrate SUB from the processing chamber PRC1 into the cleaning mechanism both are performed by a transfer mechanism ME5.

The cleaning mechanism includes a receiving chamber MC2, cleaning chambers PRC6, PRC7, and PRC8, and a drying chamber PRC9. The receiving chamber MC2 receives the substrate SUB from the transfer mechanism ME5 in a processing chamber PRC1, and holds the substrate therein. The transfer of the substrate SUB in the cleaning mechanism is performed using a transfer mechanism ME6. The substrate SUB processed by the cleaning mechanism is carried out by use of the transfer mechanism within the transfer chamber MC.

Figure 10:
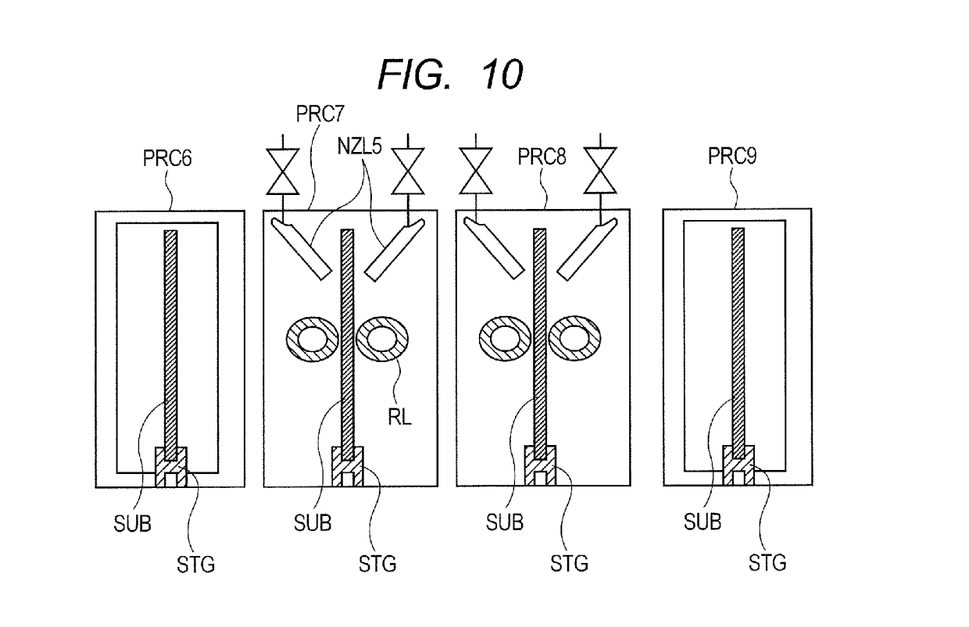
FIG. 10 is a longitudinal cross-sectional view for explaining the structure of a cleaning room.

FIG. 10 shows a longitudinal cross-sectional view for explaining the structures of the cleaning chambers PRC6, PRC7, and PRC8, and the drying chamber PRC9. In each chamber, the substrate support portion STG vertically supports the substrate SUB.

The cleaning chamber PRC6 includes a cleaning tank. The cleaning tank is filled with a cleaning liquid or pure water. The substrate SUB is immersed in the cleaning liquid or pure water. The cleaning chambers PRC7 and PRC8 both are provided with nozzles NZL5 and roller brushes RL. The nozzles NZL5 are opposed to both sides of the substrate SUB to discharge the cleaning liquid or pure water therefrom to each surface of the substrate SUB. The roller brushes RL serve to clean both sides of the substrate SUB.

In the drying chamber PRC9, the substrate SUB processed in the cleaning chamber PRC8 is dried.

Figure 11:
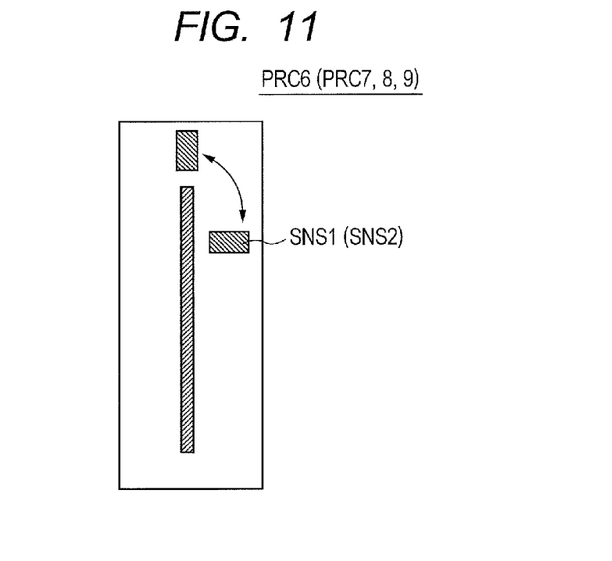
FIG. 11 is a diagram showing the position of an infrared sensor (or ultrasonic sensor) in a cleaning mechanism shown in FIG. 10.

FIG. 11 is a diagram showing the position of an infrared sensor SNS1 (or ultrasonic sensor SNS2) in the cleaning mechanism shown in FIG. 10. As mentioned above, the substrate SUB is vertically held in the cleaning mechanism. The infrared sensor SNS1 (or ultrasonic sensor SNS2) is disposed above or next to the substrate SUB.

The arrangement of the infrared sensors SNS1 (or ultrasonic sensors SNS2) in the processing chamber PRC1 is the same as that of any one of the first to third embodiments.

Also, this embodiment can obtain the same effects as those of the first to third embodiments.

Fifth Embodiment

A semiconductor device SD of this embodiment is the same as the semiconductor device SD of the first embodiment except that at least a part of the multilayer interconnection layer is an Al wiring layer. Thus, a manufacturing method of the semiconductor device SD in this embodiment is the same as that of any one of the first to fourth embodiments except for the presence of a step of forming the Al wiring layer.

FIGS. 12A and 12B, and 13A and 13B show diagrams for explaining the manufacturing method of the Al wiring layer in this embodiment. A wiring INC3 is formed over an insulating layer INSL3. The wiring INC3 is an Al wiring. The wiring INC3 is formed by selectively removing an Al film over the insulating layer INSL3.

Figure 12A:
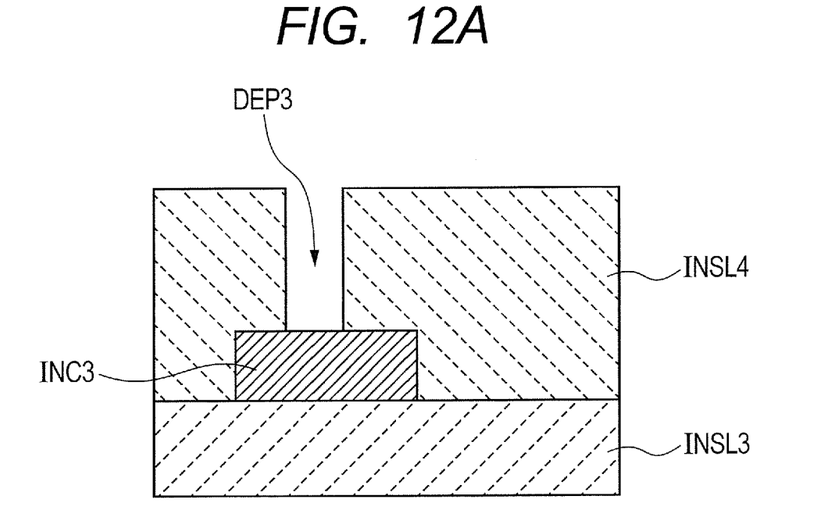
FIGS. 12A and 12B are diagrams for explaining a manufacturing method of an Al wiring layer in a fifth embodiment.

As shown in FIG. 12A, an insulating layer INSL4 is formed over the insulating layer INSL3 and wiring INC3, for example, by the CVD method. Then, a connection hole DEP3 is formed in the insulating layer INSL4. The connection hole DEP3 penetrates the insulating layer INSL4. The wiring INC3 is exposed at the bottom of the connection hole DEP3.

Figure 12B:
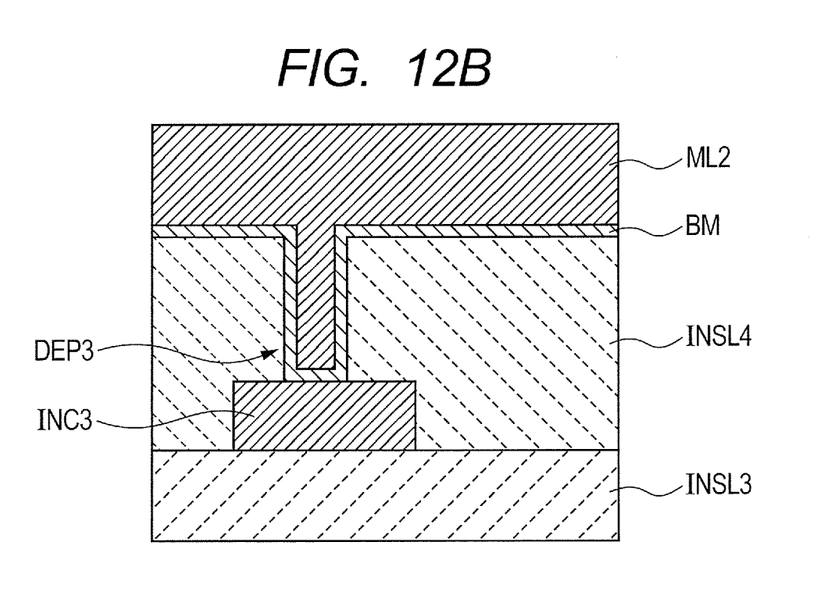

Then, as shown in FIG. 12B, the barrier metal film BM and W film ML2 are formed over the bottom and side surfaces of the connection hole DEP3 and the insulating layer INSL3. The barrier metal film BM is formed using the sputtering method and the W film ML2 is formed using the CVD method.

Figure 13A:
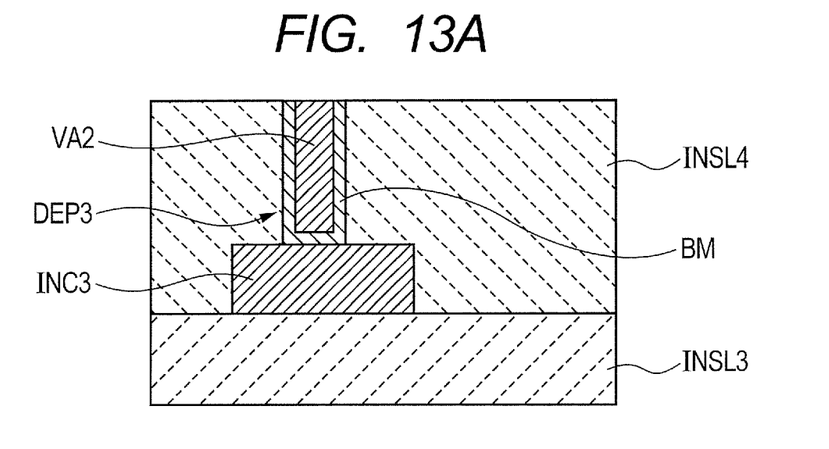
FIGS. 13A and 13B are other diagrams for explaining the manufacturing method of the Al wiring layer in the fifth embodiment.

Then, as shown in FIG. 13A, a part of the W film ML2 positioned above the insulating layer INSL4 is removed by polishing. In this way, the via VA2 is formed. The polishing is performed by use of the semiconductor manufacturing apparatus SMQ1 or SMQ2 described in any one of the first to fourth embodiments.

Figure 13B:
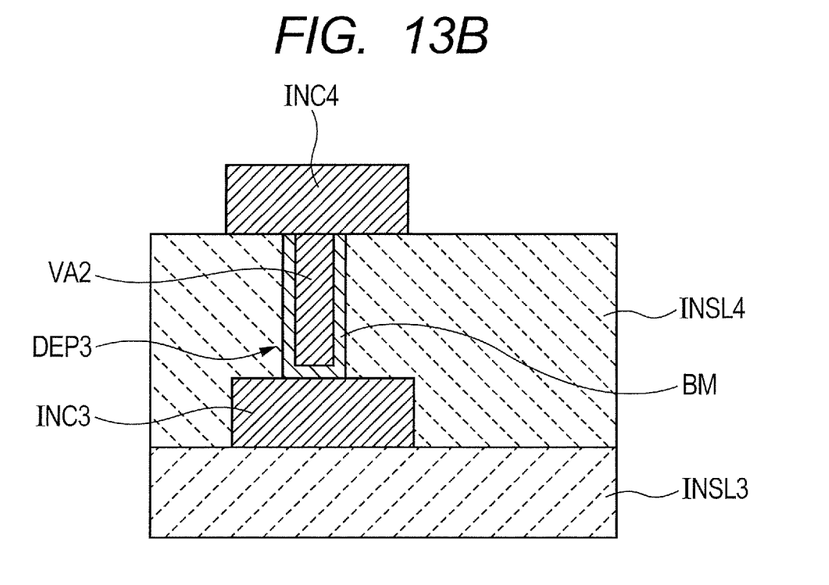

Thereafter, as shown in FIG. 13B, an Al film is formed over the insulating layer INSL4 and the via VA2. Then, the Al film is selectively removed. Thus, the wiring INC4 is formed. The wiring INC4 is coupled to the wiring INC3 via the via VA2.

In forming the via VA2 in this embodiment, the semiconductor manufacturing apparatus SMQ1 or SMQ2 shown in any one of the first to fourth embodiments is used. Thus, the photocorrosion can be prevented from being caused in the barrier metal film BM or W film ML2. Accordingly, this embodiment can suppress the occurrence of the defectives due to the photocorrosion in the semiconductor device.

The invention made by the inventors has been specifically described based on the embodiments. However, it is apparent that the invention is not limited to the above embodiments, and that various modifications and changes can be made without departing from the scope of the invention.

What is claimed is:
1. A method for manufacturing a semiconductor device, comprising the steps of:
 forming an insulating layer with a concave portion over a substrate;

forming a conductive film over the insulating film and an inside of the concave portion;

polishing and removing the conductive film positioned over the insulating layer;

cleaning the insulating layer in a light-shielded state; and moving the substrate by detecting presence or absence of the substrate in the light-shielded state using a sensor between the step of polishing and the step of cleaning, or after the step of cleaning.

2. The method for manufacturing a semiconductor device according to claim 1, wherein the sensor is an infrared sensor, and wherein in the moving step, an infrared light emitted from the substrate is detected by the infrared sensor, thereby detecting the presence or absence of the substrate.

3. The method for manufacturing a semiconductor device according to claim 2, wherein the infrared sensor is disposed on a back surface side of the substrate.

4. The method for manufacturing a semiconductor device according to claim 3, further comprising the step of providing a cover member for covering the infrared sensor.

5. The method for manufacturing a semiconductor device according to claim 1, wherein the sensor is an ultrasonic sensor, and wherein in the moving step, the ultrasonic sensor is adapted to emit ultrasound toward the substrate, and to detect the ultrasound reflected by the substrate, thereby detecting the presence or absence of the substrate.

6. The method for manufacturing a semiconductor device according to claim 5, wherein a source for emitting the ultrasound is disposed above the substrate.

7. The method for manufacturing a semiconductor device according to claim 1, wherein the conductive film is a Cu film.

8. The method for manufacturing a semiconductor device according to claim 1, wherein the concave portion penetrates the insulating layer, and wherein the conductive film is a W film.

9. A semiconductor manufacturing apparatus, comprising:

a substrate supporter for supporting a substrate;

a moving portion for moving the substrate supported by the substrate supporter;

a light shielding portion for shielding the substrate supporter and the moving portion from light by enclosing the substrate supporter and the moving portion;

a substrate detector disposed in the light shielding portion and adapted to detect presence or absence of the substrate in a light-shielded state supported by the substrate supporter; and a nozzle for discharging a cleaning liquid toward the substrate supported by the substrate supporter.

10. The semiconductor manufacturing apparatus according to claim 9, wherein the substrate supporter is adapted to support the substrate horizontally.

11. A semiconductor manufacturing apparatus, comprising:

a substrate supporter for supporting a substrate;

a moving portion for moving the substrate supported by the substrate supporter;

a light shielding portion for shielding the substrate supporter and the moving portion from light by enclosing the substrate supporter and the moving portion; and a substrate detector disposed in the light shielding portion and adapted to detect presence or absence of the substrate in a light-shielded state supported by the substrate supporter, wherein the substrate supporter is adapted to support the substrate vertically.

* * * * *